(12) United States Patent
Ogawa

(10) Patent No.: US 11,450,543 B2
(45) Date of Patent: Sep. 20, 2022

(54) SUBSTRATE STORAGE CONTAINER

(71) Applicant: Shin-Etsu Polymer Co., Ltd., Tokyo (JP)

(72) Inventor: Osamu Ogawa, Saitama (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 84 days.

(21) Appl. No.: 17/048,094

(22) PCT Filed: Apr. 17, 2019

(86) PCT No.: PCT/JP2019/016468
§ 371 (c)(1),
(2) Date: Oct. 15, 2020

(87) PCT Pub. No.: WO2019/203270
PCT Pub. Date: Oct. 24, 2019

(65) Prior Publication Data
US 2021/0159104 A1   May 27, 2021

(30) Foreign Application Priority Data

Apr. 19, 2018  (JP) .............................. JP2018-080505

(51) Int. Cl.
*H01L 21/673*  (2006.01)
*H01L 21/677*  (2006.01)

(52) U.S. Cl.
CPC .. *H01L 21/67376* (2013.01); *H01L 21/67386* (2013.01); *H01L 21/67769* (2013.01); *H01L 21/67772* (2013.01)

(58) Field of Classification Search
CPC ......... H01L 21/67376; H01L 21/67386; H01L 21/67772; H01L 21/67769; H01L 23/02;
(Continued)

(56) References Cited

U.S. PATENT DOCUMENTS 4,830,182 A * 5/1989 Nakazato ............... B65D 53/02
220/849
4,979,464 A * 12/1990 Kunze-Concewitz ......................
H01L 21/67769
392/407
(Continued)

FOREIGN PATENT DOCUMENTS

CN      107735856     2/2018
JP      S62193259     8/1987
(Continued)

OTHER PUBLICATIONS

"Written Opinion of the International Searching Authority (Form PCT/ISA/237)" of PCT/JP2019/016468, dated Jul. 9, 2019, with English translation thereof, pp. 1-9.
(Continued)

*Primary Examiner* — Chun Hoi Cheung
(74) *Attorney, Agent, or Firm* — JCIP Global Inc.

(57) ABSTRACT

The sealability against interior positive pressure is ensured, while reducing particles generated by friction in opening and closing a lid. Disclosed is a substrate storage container, including: a container body configured to store at least one substrate; and a lid configured to close an opening of the container body. In the substrate storage container, a first part of the container body, the first part being provided around the opening, is non-contact at least partially with a second part of the lid, the second part being opposed to the first part; and the first part and the second part cooperatively form a labyrinth seal structure.

7 Claims, 15 Drawing Sheets

(58) Field of Classification Search
CPC ......... H01L 23/12; H01L 23/34; H01L 23/48; H01L 23/552
See application file for complete search history.

(56) References Cited

U.S. PATENT DOCUMENTS

| | | | | |
|---|---|---|---|---|
| 4,998,550 | A | * | 3/1991 | Archambault ...... A47L 15/4257 277/921 |
| 5,046,615 | A | * | 9/1991 | Nentl ................. G11B 33/0444 |
| 5,314,068 | A | * | 5/1994 | Nakazato ............... B65D 55/12 206/454 |
| 10,837,301 | B2 | * | 11/2020 | Chun ..................... F16J 15/447 |
| 2007/0002516 | A1 | * | 1/2007 | Matsumoto ....... H01L 21/67353 361/234 |
| 2012/0145724 | A1 | * | 6/2012 | Kobinata ................ C23C 14/56 220/661 |
| 2015/0030416 | A1 | | 1/2015 | Sakiya et al. |
| 2017/0198597 | A1 | * | 7/2017 | Chun ..................... F16J 15/447 |
| 2018/0182655 | A1 | | 6/2018 | Yokoyama et al. |

FOREIGN PATENT DOCUMENTS

| | | |
|---|---|---|
| JP | S63318738 | 12/1988 |
| JP | H09252048 | 9/1997 |
| JP | 2002068364 | 3/2002 |
| JP | 2002357271 | 12/2002 |
| JP | 2008062979 | 3/2008 |
| JP | 2013021118 | 1/2013 |
| WO | 2013157462 | 10/2013 |

OTHER PUBLICATIONS

"International Search Report (Form PCT/ISA/210)" of PCT/JP2019/016468, dated Jul. 9, 2019, with English translation thereof, pp. 1-4.

* cited by examiner

SUBSTRATE STORAGE CONTAINER

CROSS-REFERENCE TO RELATED APPLICATION

This application is a 371 application of the international PCT application serial no. PCT/JP2019/016468, filed on Apr. 17, 2019, which claims the priority benefits of Japan application no. 2018-080505, filed on Apr. 19, 2018. The entirety of each of the abovementioned patent applications is hereby incorporated by reference herein and made a part of this specification.

TECHNICAL FIELD

The present disclosure relates to a substrate storage container.

BACKGROUND ART

Substrate storage containers each comprise: a container body for storing at least one substrate; a lid for closing an opening of the container body; and an annular packing provided between the container body and the lid, the substrate storage containers storing the at least one substrate in an airtight state.

Known as this type of packing are: a packing of which extension piece is formed so as to make a substantially acute angle between its extending line and a seal face; a packing that curves toward the outside of the substrate storage container when contacting a seal face; a packing that bends outwardly of an front surface of the opening; and the like (see, e.g., Patent Documents 1 and 2).

These packings can provide good sealability, since the extension pieces thereof are deformed in a direction to be pressed against the seal face, when the interior of the substrate storage container is negatively pressurized, i.e. when the pressure outside of the substrate storage container is higher than that of the interior.

CITATION LIST

Patent Literature

[Patent Literature 1] Japanese Unexamined Patent Application Publication No. 2002-068364
[Patent Literature 2] Japanese Unexamined Patent Application Publication No. 2008-062979

SUMMARY OF INVENTION

Technical Problem

However, in the above described prior art, it is difficult to reduce particles generated by friction in opening and closing the lid, while ensuring the sealability against the positive pressure in the interior. Packings are generally made of elastomers or the like, so that particles are relatively easily generated by friction. When a purging gas such as an inert gas is supplied to the interior of the substrate storage container, i.e. when the pressure inside the substrate storage container becomes positive, the extension piece is deformed in a direction to be peeled off from the seal face, so that the sealability may be lowered.

Therefore, one aspect of this disclosure is directed to reduce particles generated by friction in opening and closing the lid, while ensuring the sealability against the positive pressure in the interior.

Solution to Problem

In one aspect, provided is a substrate storage container including: a container body configured to store at least one substrate; and a lid configured to close an opening of the container body, in which a first part of the container body, the first part being provided around the opening, is non-contact at least partially with a second part of the lid, the second part being opposed to the first part; and the first part and the second part cooperatively form a labyrinth seal structure.

Advantageous Effects of Invention

In one aspect, the present disclosure enables reducing particles generated by friction in opening and closing the lid, while ensuring the sealability against the positive pressure in the interior.

DESCRIPTION OF EMBODIMENTS

Figure 1:
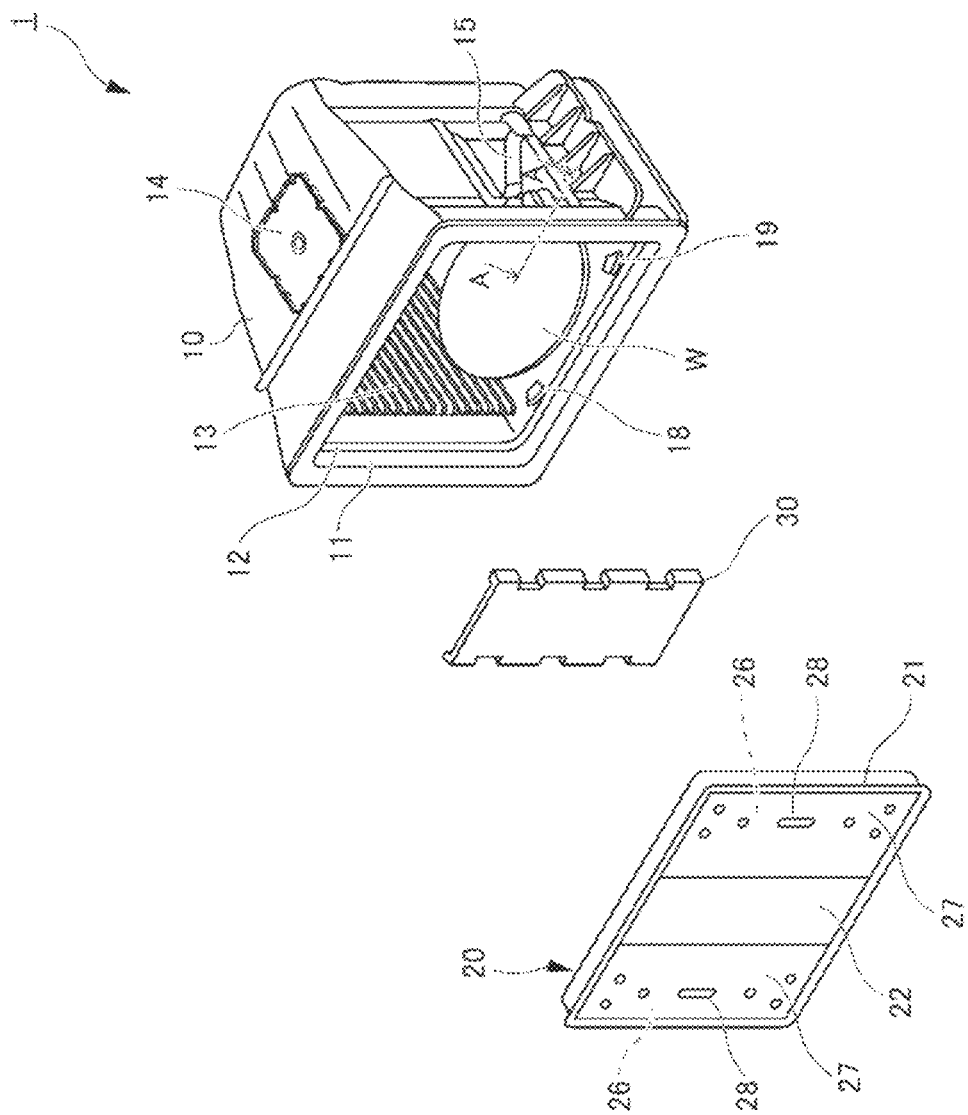
FIG. 1 is an exploded schematic perspective view showing a substrate storage container according to an example.

Hereinafter, examples will be described in detail with reference to the accompanying drawings.
FIG. 1 is an exploded schematic perspective view showing a substrate storage container 1 according to an example.

As shown in FIG. 1, the substrate storage container 1 comprises: a container body 10 for storing at least one substrate W; and a lid 20 for closing an opening 11 of the container body 10.

The container body 10 is a box-like body, and is a front open type having the opening 11 in front. The opening 11 is formed by bending with a step so as to extend outward. A surface of such stepped portion, which is formed on a front inner peripheral edge of the opening 11, is a seal face 12. The container body 10 is preferably the front open type, since it is easy to insert the at least one substrate W having a diameter of 300 mm or 450 mm. However, the container body 10 may be a bottom open type, in which the opening 11 is formed in a lower surface.

Support bodies 13 are disposed on both right and left sides inside the container body 10. The support bodies 13 have a function of carrying and positioning the at least one substrate W. Each support body 13 has multiple grooves formed in the height direction, constituting so-called groove teeth. Each substrate W is placed on two groove teeth of the same height on the right and left. A material of the support bodies 13 may be the same as that of the container body 10, but different materials may be used to improve heat resistance, drainability and slidability.

Inside the container body 10, a rear retainer (not shown) is disposed at the rear (back side) of the container body 10. When the lid 20 is closed, the rear retainer holds the at least one substrate W in a pair with a front retainer 30 described later. However, the rear retainer may not be provided in variants. The support bodies 13 may have, for example, substrate retaining portions having a "<" shape or a linear shape on the back side of the groove teeth, such that the at least one substrate W is held by the front retainer 30 and the substrate retaining portions. The support bodies 13 and the rear retainer are provided on the container body 10 by insert-molding, fitting or the like.

The at least one substrate W is supported by the support bodies 13 and stored in the container body 10. An example of the at least one substrate W is a silicon wafer. However, the at least one substrate W is not particularly limited thereto and may be a quartz wafer, a gallium arsenide wafer, a glass wafer, a resin wafer or the like.

On a middle portion of a ceiling of the container body 10, a robotic flange 14 is detachably provided. A conveying robot in a factory grips the robotic flange 14 of the substrate storage container 1 in which the at least one substrate W is stored in a clean condition, and conveys it to a processing device for each process for processing the at least one substrate W.

Further, on middle portions of outer surfaces of both sides of the container body 10, manual handles 15 are respectively provided in a detachable manner, which are gripped by an operator.

On a bottom surface of the container body 10, at least one air supply valve 18 and at least one air exhaust valve 19 having a check valve function are provided, for example. These valves are arranged such that an inert gas such as nitrogen gas or dry air: is supplied from the at least one air supply valve 18 to the inside of the substrate storage container 1 closed by the lid 20; and is discharged from the at least one air exhaust valve 19. Thereby, the gas inside the substrate storage container 1 is replaced; and the airtightness of the container 1 is maintained. The at least one air supply valve 18 and the at least one air exhaust valve 19 are preferably in positions deviated from the position of the at least one substrate W projected on the bottom surface. However, the numbers and positions of the at least one air supply valve 18 and the at least one air exhaust valve 19 are not limited to those shown in the drawing. The at least air supply valve 18 and the at least one air exhaust valve 19 have a filter for filtering gas.

The inside gas is replaced for the purposes of blowing off impurity substances on the at least one substrate W in storage; lowering the inside humidity; and the like, thereby keeping the cleanliness inside of the substrate storage container 1 in transit. It is possible to confirm whether the gas replacement is reliably performed by detecting the gas on the air exhaust valve 19 side. When the inside gas is replaced; or when the lid 20 is attached to the container body 10 to close it, the interior of the substrate storage container 1 is positively pressurized. Conversely, when the lid 20 is removed from the container body 10, the interior of the substrate storage container 1 is negatively pressurized.

The lid 20 has a substantially rectangular shape and is attached to the front surface of the opening 11 of the container body 10. As shown in FIG. 1, the lid 20 includes: a lid body 21; a pair of locking mechanisms 26 which is provided on the lid body 21 to lock the lid body 21; and a pair of plate 27 detachably covering the respective locking mechanism 26. The lid 20 is detachably fitted to a front portion of the opening of the container body 10. The lid 20 is locked by the pair of locking mechanisms 26, when latch claws of the locking mechanisms 26 are engaged in latch holes (not shown) formed in the container body 10. The lid body 21, the pair of locking mechanisms 26 and the pair of plates 27 of the lid 20 are molded using the same molding material as that of the container body 10.

On a middle portion of the lid 20, the elastic front retainer 30 is detachably mounted or integrally formed. The front retainer 30 holds a front peripheral edge of the at least one substrate W horizontally.

Similarly to the groove teeth and the substrate retaining portions of the support bodies 13, this front retainer 30 is a member to directly contact with the wafers. Hence, the front retainer 30 is made of a material having good drainability and slidability. The front retainer 30 may also be provided on the lid 20 by insert-molding, fitting or the like.

Examples of materials of the container body 10 and the lid 20 include a thermoplastic resin such as polycarbonate, cycloolefin polymer, polyetherimide, polyether sulfone, polyether ether ketone and liquid crystal polymer. The thermoplastic resin may include a conductive agent such as conductive carbon, conductive fiber, metal fiber and conductive polymer; antistatic agents; and ultraviolet absorbers, which are added appropriately.

Note that, in the examples of the disclosure, the substrate storage container 1 is not provided with an annular packing between the container body 10 and the lid 20, which are generally used. Alternatively, a labyrinth seal structure is formed between the container body 10 and the lid 20. Examples of the labyrinth seal structure will be described below.

Figure 2:
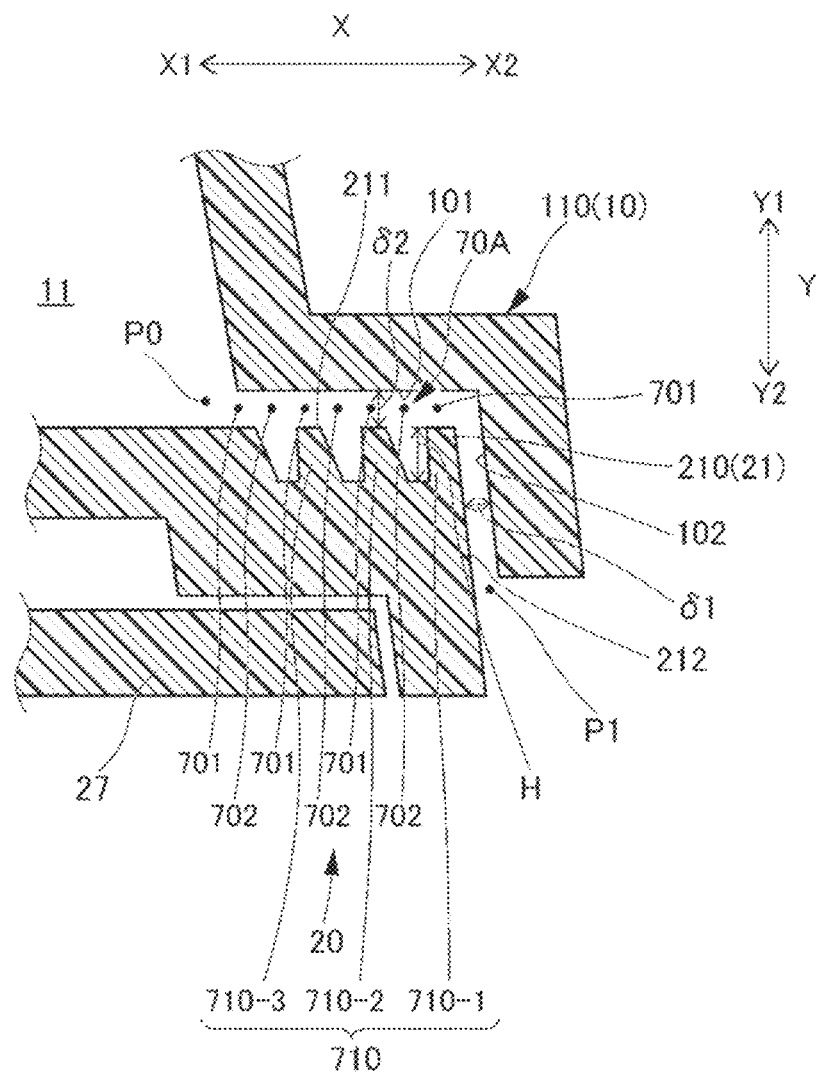
FIG. 2 is a schematic cross-sectional view showing an exemplary labyrinth seal structure.

FIG. 2 is a schematic cross-sectional view showing an exemplary labyrinth seal structure 70A. FIG. 2 (as well as FIG. 3 and the subsequent figures described below) is a cross-sectional view of the container body 10 of FIG. 1 along line A-A (i.e. a cross-sectional view of the container body 10 with the lid 20 closed). In FIG. 2, two orthogonal directions of an X direction and a Y direction are defined. In the X direction, the X1 side is the inner side, and the X2 side is the outer side. The X direction corresponds to a radial direction around the opening 11. In the Y direction, the Y1 side is the inner side, and the Y2 side is the outer side. The Y direction (an example of a first direction) is a direction substantially parallel to a surface of the at least one substrate W (see FIG. 1) when stored in the container body 10.

As shown in FIG. 2, a first part 110 of the container body 10, the first part 110 being provided around the opening 11, is non-contact at least partially with a second part 210 of the lid 20, the second part 210 being opposed to the first part 110. The first part 110 and the second part 210 cooperatively form a labyrinth seal structure 70A.

Specifically, the first part 110 has: a surface 101 (an example of a first surface) facing the second part 210 in the Y direction; and a surface 102 facing the second part 210 in the X direction. The surface 101 forms a seal face 12 (see FIG. 1). Similarly, the second part 210 has: a surface 211 (an example of a first surface) facing the first part 110 in the Y direction; and a surface 212 facing the first part 110 in the X direction. Thus, the first part 110 and the second part 210 face each other in the Y direction and in the X direction.

In FIG. 2, a clearance δ2 between the surface 101 and the surface 211 is substantially same as a clearance δ1 (the smallest clearance) between the surface 102 and the surface 212. However, the clearances δ1 and δ2 may be different from each other. The clearance δ1 and the clearance δ2 are set such that neither a contact between the surface 101 and the surface 211 nor a contact between the surface 102 and the surface 212 occurs due to tolerances or the like. The clearances δ1 and δ2 are preferably larger than 0 mm and equal to or less than 1.0 mm; and more preferably larger than 0 mm and equal to or less than 0.5 mm. This is because that the sealability cannot be effectively obtained, if the clearances are larger than 1.0 mm.

The degree of non-contacting between: the first part 110 of the container body 10 around the opening 11; and the second part 210 of the lid 20, which is opposed to the first part 110 can be evaluated as: "best" when the degree of contacting is 0%, since no particles occur; "good" when the degree of contacting is 0-10%; "tolerable" when the degree of contacting is 10-50% (which means that the superiority over the particles is reduced, although it still can be used); and "NG" when the degree of contacting is greater than 50%.

In FIG. 2, the labyrinth seal structure 70A is formed by the surface 101 of the first part 110 and the surface 211 of the second part 210.

Specifically, the second part 210 has a group of ribs 710 that projects toward the first part 110. In FIG. 2, the group of ribs 710 includes three ribs 710-1, 710-2 and 710-3. However, the number of ribs may be appropriately selected. For example, any one or two of the three ribs 710-1, 710-2 and 710-3 may be omitted, or at least one additional rib may be set.

The ribs 710-1, 710-2 and 710-3 are formed around the entire circumference of the opening 11. For example, the ribs 710-1, 710-2 and 710-3 may be formed so as to have a uniform cross section around the entire circumference of the opening. However, in variants, the rib 710-1, 710-2 or 710-3 may have a varied cross section partially in the circumferential direction of the opening 11; or may be discontinuous partially in the circumferential direction of the opening 11.

The ribs 710-1, 710-2 and 710-3 preferably have forms selected with consideration of the moldability of the lid body 21, i.e. forms removable from its mold. As shown in FIG. 2, peripheral surfaces of the ribs 710-2 and 710-3 on the outer side are inclined inwardly as proceeding to the Y1 side. In this case, the sealability against positive pressure in the interior can be increased as compared with the case where peripheral surfaces on the inner side are inclined outwardly as proceeding to the Y1 side (the principles will be described later). However, in variants, the ribs 710-2 and 710-3 may have the inner peripheral surfaces inclined outwardly as proceeding to the Y1 side; or the ribs 710-2 and 710-3 may not have an inclined peripheral surface.

The ribs 710-1, 710-2 and 710-3 preferably have a height difference within 10 mm (see the height H in FIG. 2). For example, the height difference may be within the range of 1 mm to 10 mm. If the height difference (see the height H in FIG. 2) is five times or more, preferably 10 times or more of the clearance δ2, large sealing effect can be expected. The shape of the second part 210 on the lid body 21 side and the shape of the first part 110 on the container body 10 side may be exchanged. Incidentally, in the drawings, the distances of δ1 and δ2 are drawn large with respect to the height of H in order to explain the labyrinth effect in a readily understandable manner.

Figure 3:
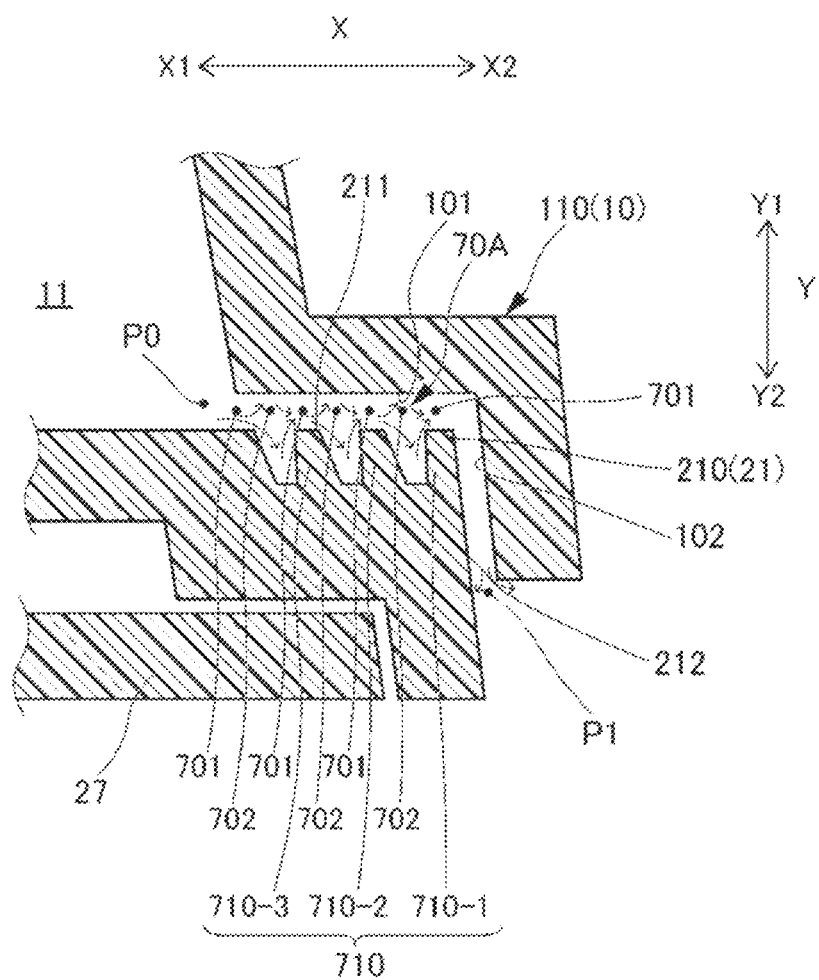
FIG. 3 is a diagram explaining the sealing effect by the labyrinth seal structure shown in FIG. 2.

FIG. 3 is a diagram explaining the sealing effect by the labyrinth seal structure 70A shown in FIG. 2.

As shown in FIG. 3 (also in FIG. 2), the labyrinth seal structure 70A includes narrow portions 701 and enlarged portions 702 that are alternately provided in the X-direction, Therefore, when the interior of the container body 10 is at a positive pressure, pressure loss occurs during the flow from the interior P0 to the exterior P1 of the container body 10, since rapid expansions in the area of the flow passage when moving from the narrow portions 701 to the enlarged portions 702; and rapid contractions in the area of the flow passage when moving from the enlarged portions 702 to the narrow portions 701 are alternatively repeated, as schematically shown by the arrows in FIG. 3. Such pressure loss also occurs when moving from the interior P0 to the first narrow portion 701 of the container body 10, since the area of the flow passage decreases rapidly. Further, the pressure loss also occurs when moving to the exterior P1 of the container body 10, since the area of the flow passage expands rapidly. In this manner, the pressure is gradually changed between the interior P0 and the exterior P1 in the labyrinth seal structure 70A. As a result, the flow of gas is reduced or eliminated between the interior P0 and the exterior P1 through the labyrinth seal structure 70A, exhibiting the sealing function. In other words, the sealability against the positive pressure in the interior is ensured.

Similarly, the sealing function is also exhibited, when the interior of the container body 10 is at a negative pressure. This is because that the pressure loss also occurs during the flow from the exterior P1 to the interior P0 of the container body 10, since the rapid expansions in the area of the flow passage when moving from the narrow portions 701 to the enlarged portions 702; and the rapid contractions in the area of the flow passage when moving from the enlarged portions 702 to the narrow portions 701 are alternatively repeated.

The number of repetitions of the rapid expansion and the rapid contraction is preferably at least three times or more including: the rapid contraction from the interior P0 of the container body 10; and the rapid expansion to the exterior P1 of the container body 10. That is, as described above, at least one rib needs to be provided. However, the number of ribs is preferably two or more to increase the sealability.

The substrate storage container 1 is used many times, and the lid 20 is opened and closed many times. In this regard, in a comparative example where a packing made of an elastomer or the like is used to ensure the sealability, particles are often generated by friction. Specifically, since the packing is slid on the seal face when the lid body is opened or closed, such sliding easily generates particles. In the state where the particles exist and if the interior of the container body is at a negative pressure when opening the lid, the particles may enter the interior of the container body and contaminate the at least one substrate W.

Further, in the comparative example where the packing made of an elastomer or the like is used to ensure the sealability, the packing may stick to the seal face of the container body; and opening and closing torques of the lid 20 may become excessive, causing errors and the like in the manufacturing process.

On the other hand, according to the example shown in FIG. 2, since no packing is used, the above-mentioned disadvantages caused by the use of the packing (i.e., the problems in the comparative example) can be avoided. According to the example shown in FIG. 2, since the first part 110 and the second part 210 are not in contact with each other, there is a low possibility that particles are generated from the first part 110 and the second part 210 by friction.

Further, according to the example shown in FIG. 2, although the first part 110 and the second part 210 are non-contact, the labyrinth seal structure 70A can ensure high sealability. The sealing effect by the labyrinth seal structure 70 A is as described above with reference to FIG. 3.

As seen above, according to the example shown in FIG. 2, it is possible to ensure the sealability against the positive pressure and the negative pressure in the interior of the container body 10, while reducing particles generated by friction in opening and closing the lid 20.

In the example shown in FIG. 2, the labyrinth seal structure 70A is formed between the surface 101 of the first part 110 and the surface 211 of the second part 210. However, alternatively or additionally, a similar labyrinth seal structure may be formed between the surface 102 of the first part 110 and the surface 212 of the second part 210.

In the example shown in FIG. 2, the group of ribs 710 is formed on the second part 210. Alternatively, a similar group of ribs 710 may be formed on the first part 110.

Figure 4:
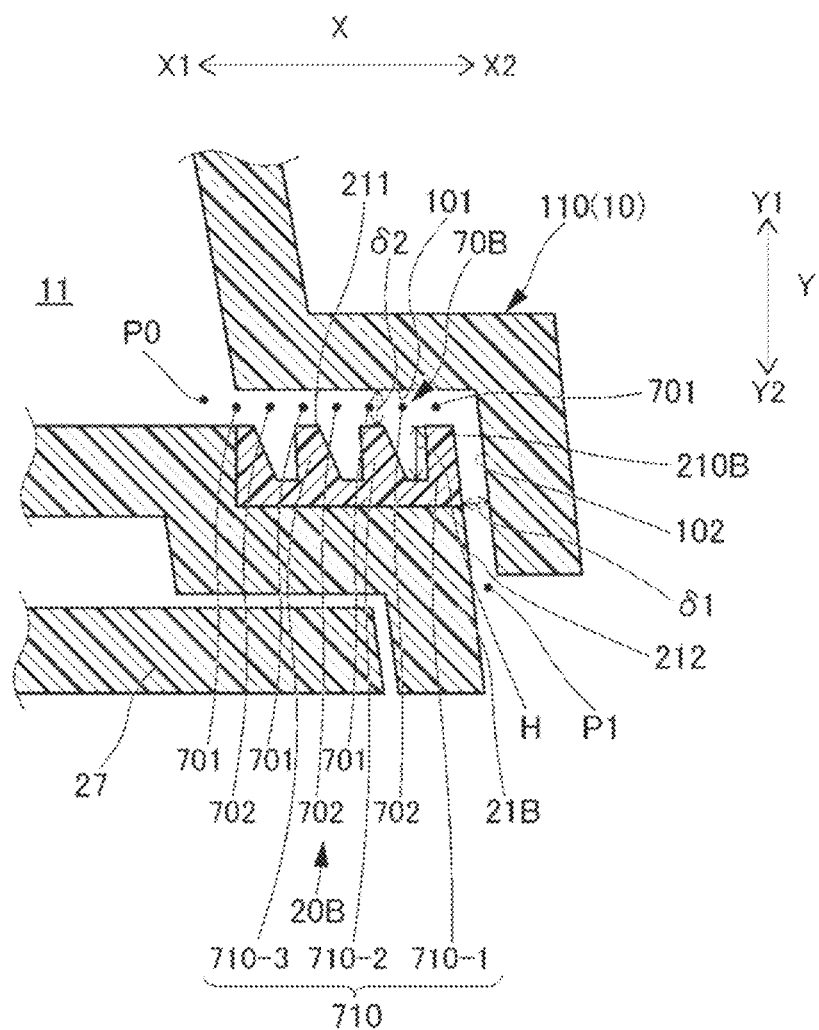
FIG. 4 is a schematic cross-sectional view showing another exemplary labyrinth seal structure.

FIG. 4 is a schematic cross-sectional diagram showing another exemplary labyrinth seal structure 70B. In the example shown in FIG. 4, the same components as those in the example shown in FIG. 2 described above are denoted by the same reference signs, and description thereof may be omitted.

The example shown in FIG. 4 differs from the example shown in FIG. 2 in that the lid 20 is replaced with the lid 20B. The lid 20B differs from the lid 20 in that a second part 210B is attached to a lid body 21B. Specifically, in the lid 20, the second part 210 forms a part of the lid body 21 (the second part 210 and the lid body 21 are integrally formed). In contrast, in the lid 20B shown in FIG. 4, the second part 210B is not a part of the lid body 21B. The second part 210B is attached and integrated to the lid body 21B.

The lid body 21B is made of a resin material such as polycarbonate, cycloolefin polymer, liquid crystal polymer, polyether ether ketone or polypropylene. On the other hand, the second part 210B is made of a resin material having high slidability, such as polypropylene, polyether ketone, polybutylene terephthalate or polyacetal. Incidentally, even when the lid 20B is required to have low-hygroscopicity, the second part 210B may be made of a material that is not low-hygroscopic, since the second part 210B is a relatively small part of the lid 20B.

As a material of the second part 210B, it is possible to use thermoplastic elastomers such as polyester-based elastomers, polyolefin-based elastomers, fluorine-based elastomers or urethane-based elastomers; or elastic bodies such as fluorine rubber, ethylene propylene rubber or silicone rubber. From the viewpoint of modifying the sealing properties, these materials may contain a filler made of carbon, glass fiber, mica, talc, silica, calcium carbonate or the like; or a resin such as polyethylene, polyimide, polyacetal, a fluorine-based resin or a silicone resin, which are added selectively in a predetermined amount. Further, from the viewpoint of imparting conductivity and antistatic properties, carbon fibers, metal fibers, metal oxides, various antistatic agents and the like may be appropriately added.

The second part 210B is integrated to the lid body 21B by fitting, for example. Alternatively, the second part 210B may be integrated to the lid body 21B by adhesion. Alternatively, the second part 210B may be integrally molded with the lid body 21B (e.g., two-color molded).

In FIG. 4, the first part 110 of the container body 10, the first part 110 being provided around the opening 11, is non-contact at least partially with a second part 210B of the lid 20B, the second part 210B being opposed to the first part 110. The first part 110 and the second part 210B cooperatively form the labyrinth seal structure 70B.

The labyrinth seal structure 70B itself may be the same as the labyrinth seal structure 70A shown in FIG. 2. However, in FIG. 4, since the second part 210B is a separate body from the lid body 21B, the second part 210B can be molded separately from the lid body 21B. Therefore, the second part 210B can be designed without consideration of the moldability of the lid body 21B.

Incidentally, the second part 210B may be provided on the container body 10 side.

The example shown in FIG. 4 can also achieve the same effect as that of the example shown in FIG. 2. Further, according to the example shown in FIG. 4, since the second part 210B is a separate body from the lid body 21B, the second part 210B can be made of a material different from the lid body 21B. Hence, the second part 210B can be made of a resin material having high slidability. In this case, although the first part 110 and the second part 210B should be non-contact according to the design values (the nominal values), even if the first part 110 and the second part 210B come into contact due to the tolerances of the components and the like, the generation of particles can be minimized.

Further, even in the case where a part of the second member 210B contacts with the first part 110, the second member 210B that is made of an elastic body can absorb it; and the other clearance δ2 can be ensured. Therefore, the dimensional accuracy of the molded articles can be less strict, so that the control becomes easy and stable.

Figure 5:
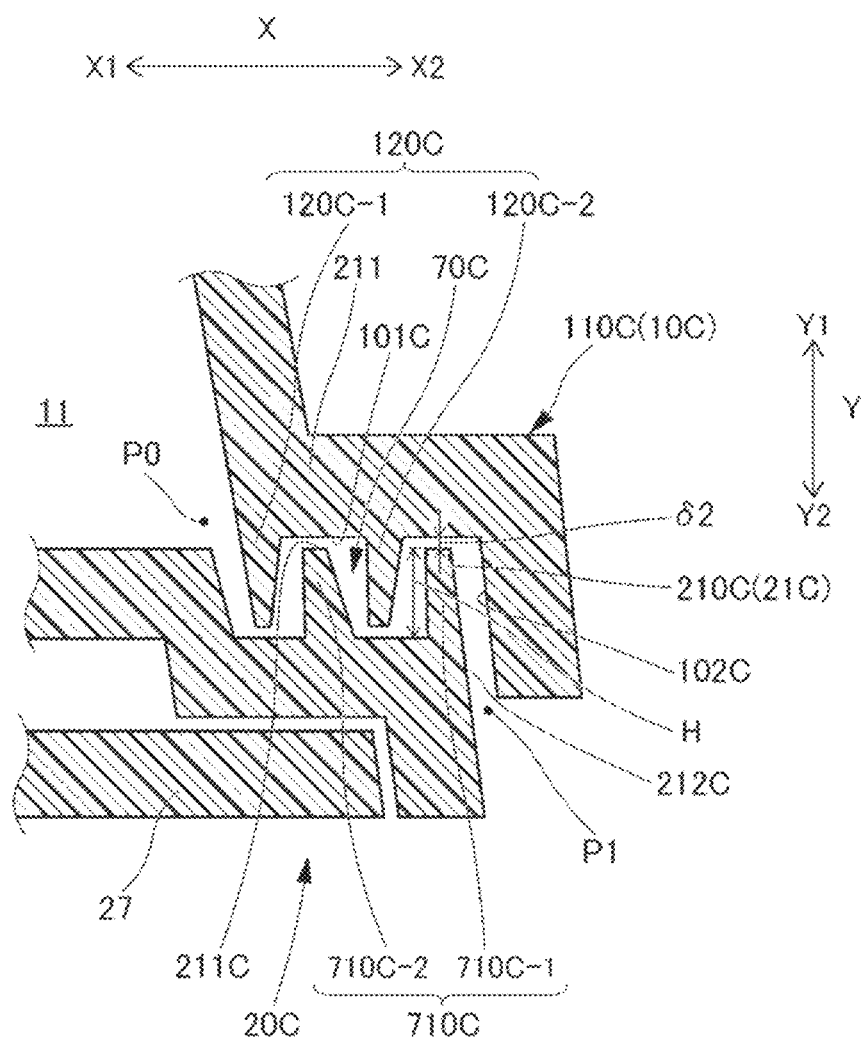
FIG. 5 is a schematic cross-sectional view showing another exemplary labyrinth seal structure.

FIG. 5 is a schematic cross-sectional diagram showing another exemplary labyrinth seal structure 70C. In the example shown in FIG. 5, the same components as those in the example shown in FIG. 2 described above are denoted by the same reference signs, and description thereof may be omitted.

The example shown in FIG. 5 differs from the example shown in FIG. 2 in that: the container body 10 is replaced with a container body 10C; and the lid 20 is replaced with a lid 20C.

The container body 10C differs from the container body 10 shown in FIG. 2 in that the first part 110 is replaced with a first part 110C. The lid 20C differs from the lid 20 shown in FIG. 2 in that the lid body 21 is replaced with a lid body 21C. The lid body 21C differs from the lid body 21 shown in FIG. 2 in that the second part 210 is replaced with a second part 210C.

As shown in FIG. 5, the first part 110C of the container body 10C, the first part 110C being provided around the opening 11, is non-contact at least partially with the second part 210 of the lid 20C, the second part 210C being opposed to the first part 110C. The first part 110C and the second part 210C cooperatively form the labyrinth seal structure 70C.

Specifically, the first part 110C has: a surface 101C (an example of the first surface) facing the second part 210C in the Y direction; and a surface 102C facing the second part 210C in the X direction. The surface 101C forms the seal face 12 (see FIG. 1). Similarly, the second part 210C has: a surface 211C (an example of the first surface) facing the first part 110C in the Y direction; and a surface 212 facing the first part 110C in the X direction. Thus, the first part 110C and the second part 210C face each other in the Y direction and in the X direction.

In FIG. 5, the labyrinth seal structure 70C is formed by the surface 101C of the first part 110C and the surface 211C of the second part 210C.

Specifically, the first part 110C has a group of ribs 120C that projects toward the second part 210C. In FIG. 5, the group of ribs 120C includes two ribs 120C-1 and 120C-2. However, the number of ribs may be appropriately selected. For example, any one of the two ribs 120C-1 and 120C-2 may be omitted, or at least one additional rib may be set.

The second part 210C has a group of ribs 710C that projects toward the first part 110C. In FIG. 5, the group of ribs 710C includes two ribs 710C-1 and 710C-2. However, the number of ribs may be appropriately selected. For example, any one of the two ribs 710C-1 and 710C-2 may be omitted, or at least one additional rib may be set.

The ribs 120C-1, 120C-2 and the ribs 710C-1, 710C-2 are formed around the entire circumference of the opening 11. For example, the ribs 120C-1, 120C-2 and the ribs 710C-1, 710C-2 may be formed so as to have a uniform cross section around the entire circumference of the opening. However, in variants, at least one of the ribs 120C-1, 120C-2 and the ribs 710C-1, 710C-2 may have varied cross sections partially in the circumferential direction of the opening 11; or may be discontinuous partially in the circumferential direction of the opening 11.

The ribs 120C-1 and 120C-2 preferably have forms selected with consideration of the moldability of the container body 10C, i.e. forms removable from its mold. As shown in FIG. 5, peripheral surfaces of the ribs 120C-1 and 120C-2 on the outer side are inclined inwardly as proceeding to the Y2 side. However, in variants, peripheral surfaces of the ribs 120C-1 and 120C-2 on the inner side may be inclined outwardly as proceeding to the Y2 side.

The ribs 710C-1 and 710C-2 preferably have forms selected with consideration of the moldability of the lid body 21C, i.e. forms removable from its mold. As shown in FIG. 5, a peripheral surface of the rib 710-2 on the outer side is inclined inwardly as proceeding to the Y1 side. However, in variants, a peripheral surface of the rib 710-2 on the inner side may be inclined outwardly as proceeding to the Y1 side.

The ribs 120C-1, 120C-2 and the ribs 710C-1, 710C-2 preferably have a height difference within 10 mm (see the height H in FIG. 5). For example, the height difference may be within the range of 1 mm to 10 mm. If the height difference is five times or more, preferably 10 times or more of the clearance δ2, large sealing effect can be expected.

The example shown in FIG. 5 can also achieve the same effect as that of the example shown in FIG. 2. In the example shown in FIG. 5, the flow path of the gas has a key-like shape, and the flow path is elongated, the path can be lengthened, so that higher sealing effect can be expected.

In the example shown in FIG. 5, the labyrinth seal structure 70C is formed between the surface 101C of the first part 110C and the surface 211C of the second part 210C. However, alternatively or additionally, a similar labyrinth seal structure may be formed between the surface 102C of the first part 110C and the surface 212C of the second part 210C.

Figure 6:
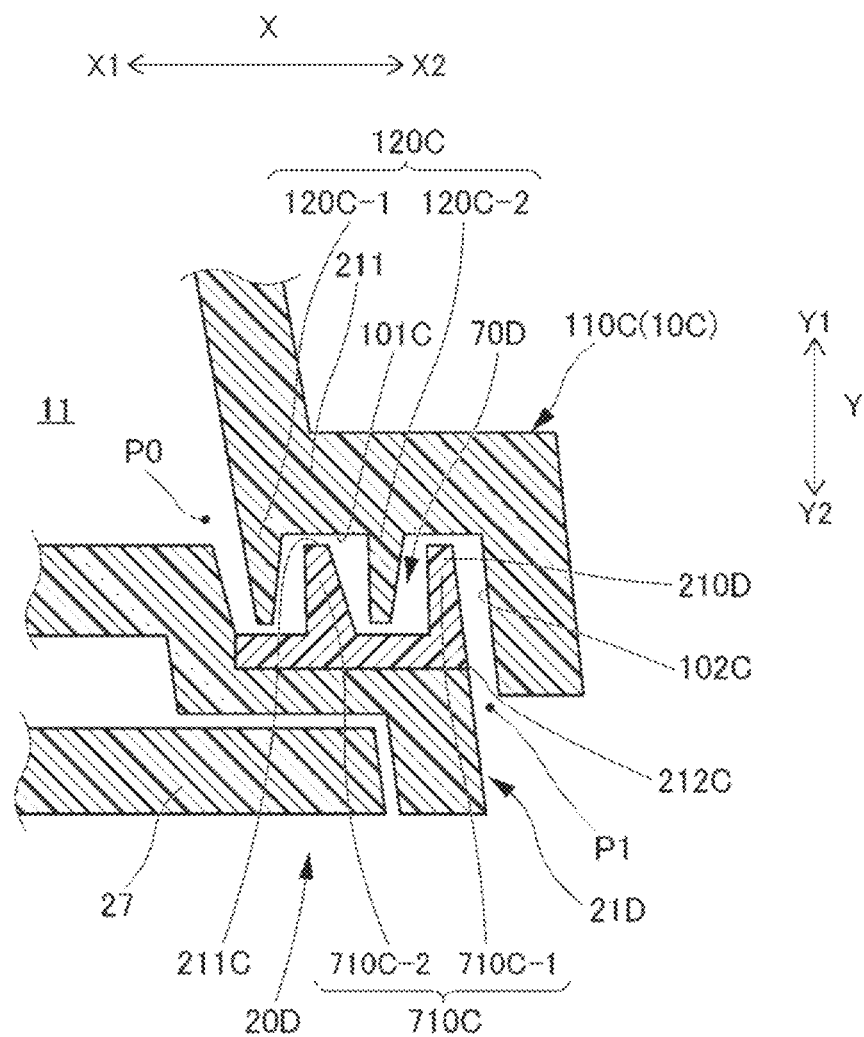
FIG. 6 is a schematic cross-sectional view showing another exemplary labyrinth seal structure.

FIG. 6 is a schematic cross-sectional diagram showing another exemplary labyrinth seal structure 70D. In the example shown in FIG. 6, the same components as those in the example shown in FIG. 5 described above are denoted by the same reference signs, and description thereof may be omitted.

The example shown in FIG. 6 differs from the example shown in FIG. 5 in that the lid 20C is replaced with a lid 20D. The lid 20D differs from the lid 20C in that a second part 210D is attached to a lid body 21D. Specifically, in the lid 20C, the second part 210C forms a part of the lid body 21C (the second part 210C and the lid body 21C are integrally formed). In contrast, in the lid 20D shown in FIG. 6, the second part 210D is not a part of the lid body 21D. The second part 210D is attached and integrated to the lid body 21D.

The lid body 21D is made of a low-hygroscopic resin material such as polyether ether ketone or polypropylene. On the other hand, the second part 210D is made of a resin material having high slidability, such as polypropylene, polyether ketone, polybutylene terephthalate or polyacetal. Incidentally, even when the lid 20D is required to have low-hygroscopicity, the second part 210D may be made of a material that is not low-hygroscopic, since the second part 210D is a relatively small part of the lid 20D.

As a material of the second part 210D, it is possible to use thermoplastic elastomers such as polyester-based elastomers, polyolefin-based elastomers, fluorine-based elastomers or urethane-based elastomers; or elastic bodies such as fluorine rubber, ethylene propylene rubber or silicone rubber. From the viewpoint of modifying the sealing properties, these materials may contain a filler made of carbon, glass fiber, mica, talc, silica, calcium carbonate or the like; or a resin such as polyethylene, polyimide, polyacetal, a fluorine-based resin or a silicone resin, which are added selectively in a predetermined amount. Further, from the viewpoint of imparting conductivity and antistatic properties, carbon fibers, metal fibers, metal oxides, various antistatic agents and the like may be appropriately added.

Incidentally, even when the lid 20D is required to have low-hygroscopicity, the second part 210D may be made of a material that is not low-hygroscopic, since the second part 210D is a relatively small part of the lid 20D.

The second part 210D is integrated to the lid body 21D by fitting, for example. Alternatively, the second part 210D may be integrated to the lid body 21D by adhesion. Alternatively, the second part 210D may be integrally molded with the lid body 21D (e.g., two-color molded).

In FIG. 6, the first part 110C of the container body 10, the first part 110C being provided around the opening 11, is non-contact at least partially with a second part 210D of the lid 20D, the second part 210D being opposed to the first part 110C. The first part 110C and the second part 210D cooperatively form the labyrinth seal structure 70D.

The labyrinth seal structure 70D itself may be the same as the labyrinth seal structure 70C shown in FIG. 5. However, in FIG. 6, since the second part 210D is a separate body from the lid body 21D, the second part 210D can be molded separately from the lid body 21D. Therefore, the second part 210D can be designed without consideration of the moldability of the lid body 21D.

The example shown in FIG. 6 can also achieve the same effect as that of the example shown in FIG. 5. Further, according to the example shown in FIG. 6, since the second part 210D is a separate body from the lid body 21D, the second part 210D can be made of a material different from the lid body 21D. Hence, the second part 210D can be made of a resin material having high slidability. In this case, although the first part 110C and the second part 210D should be non-contact according to the design values (the nominal values), even if the first part 110C and the second part 210D come into contact due to the tolerances of the components and the like, the generation of particles can be minimized. Further, even in the case where a part of the second member 210D contacts with the first part 110C, the second member 210B that is made of an elastic body can absorb it; and the other clearance can be ensured. Therefore, the dimensional accuracy of the molded articles can be less strict, so that the control becomes easy and stable.

Figure 7A:
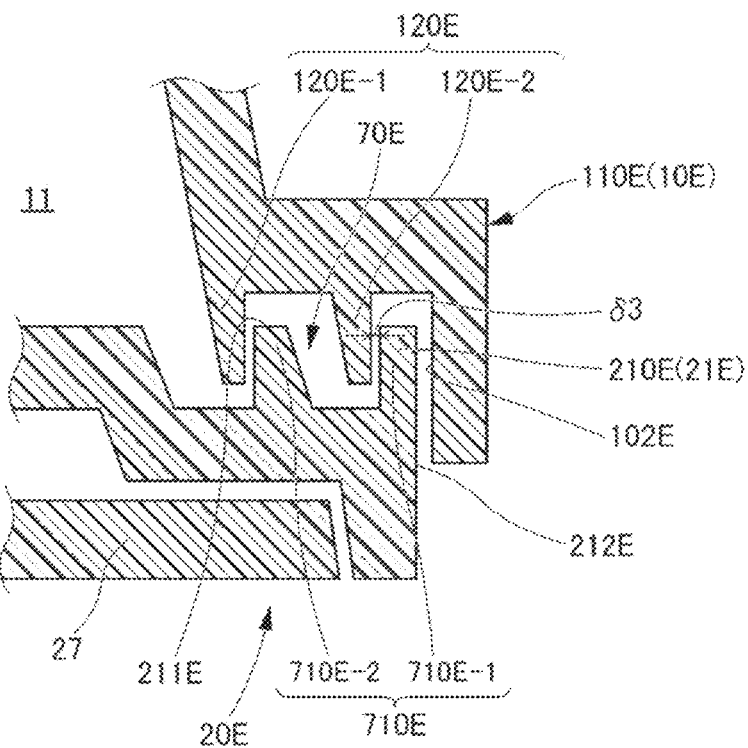
FIG. 7A is a schematic cross-sectional view showing another exemplary labyrinth seal structure.
Figure 7B:
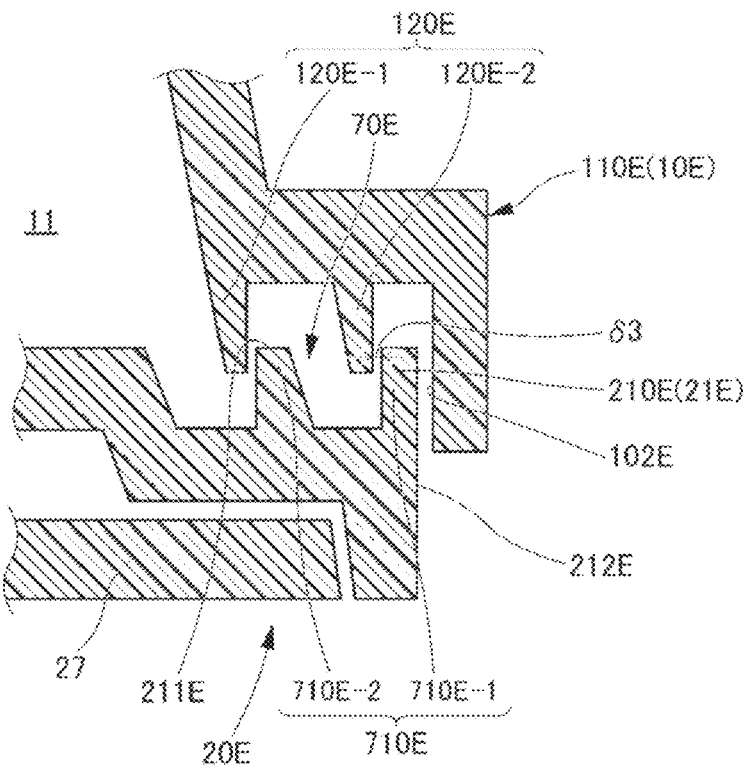
FIG. 7B is a diagram explaining the effect by the structure of FIG. 7A.

FIGS. 7A and 7B each are a schematic cross-sectional diagram showing another exemplary labyrinth seal structure 70E. In the example shown in FIGS. 7A and 7B, the same components as those in the example shown in FIG. 5 described above are denoted by the same reference signs, and description thereof may be omitted.

In the example shown in FIG. 7A, the labyrinth seal structure 70C of the example shown in FIG. 5 is replaced with the labyrinth seal structure 70E. Specifically, the ribs 120C-1, 120C-2 and the ribs 710C-1, 710C-2 of the example in FIG. 5 are replaced with the ribs 120E-1, 120E-2 and the ribs 710E-1, 710E-2 in the example shown in FIGS. 7A and 7B.

The ribs 120 E-1, 120 E-2 and the ribs 710 E-1, 710 E-2 are formed such that a clearance $\delta 3$ in the X direction between the rib 120 E-1 and the rib 710 E-2 and a clearance $\delta 3$ in the X direction between the rib 120 E-2 and the rib 710 E-1 are constant in the Y direction. The clearances $\delta 3$ are preferably larger than 0 mm and equal to or less than 1.0 mm; and more preferably larger than 0 mm and equal to or less than 0.5 mm. This is because that the sealability cannot be effectively obtained, if the clearances are larger than 1.0 mm.

According to the example shown in FIG. 7A, since the clearances between side surfaces of the neighboring ribs that are positioned to face each other in the X direction when the lid 20E is closed are arranged to be constant (in FIG. 7A, the clearance $\delta 3$ in the X direction between the rib 120 E-1 and the rib 710 E-2 and the clearance $\delta 3$ in the X direction between the rib 120 E-2 and the rib 710 E-1), the sealing effect can be maintained, even if the lid is not necessarily completely closed (see FIG. 7B). Hence, it is possible to secure the sealing condition until the very last moment when opening and closing the lid 20E. Further, even if the lid 20E is locked in a halfway state, good sealability can be secured.

The example shown in FIG. 7A may also be configured such that the second parts (i.e. parts forming the ribs 710E-1 and 710E-2) are separate bodies and attached to the lid body 21E as in the example of FIG. 6.

Figure 8:
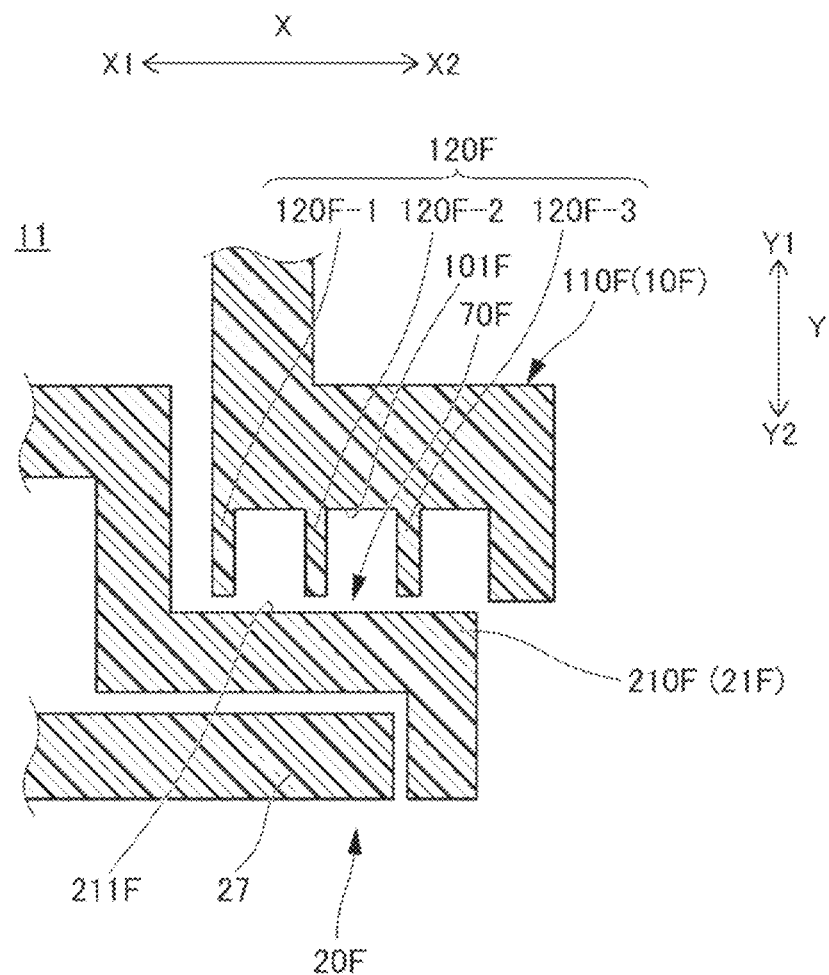
FIG. 8 is a schematic cross-sectional view showing another exemplary labyrinth seal structure.

FIG. 8 is a schematic cross-sectional diagram showing another exemplary labyrinth seal structure 70F. FIG. 8 shows an example where the ribs are formed on the container body side.

The example shown in FIG. 8 differs from the example shown in FIG. 5 in that: the container body 10C is replaced with a container body 10F; and the lid 20C is replaced with a lid 20F.

The container body 10F differs from the container body 10C shown in FIG. 5 in that the first part 110C is replaced with a first part 110F. The lid 20F differs from the lid 20C shown in FIG. 5 in that the lid body 21C is replaced with a lid body 21F. The lid body 21F differs from the lid body 21C shown in FIG. 5 in that the second part 210C is replaced with a second part 210F.

As shown in FIG. 8, the first part 110F of the container body 10F, the first part 110F being provided around the opening 11, is non-contact at least partially with the second part 210F of the lid 20F, the second part 210F being opposed to the first part 110F. The first part 110F and the second part 210F cooperatively form the labyrinth seal structure 70F. The labyrinth seal structure 70F is formed by the surface 101F of the first part 110F and the surface 211F of the second part 210F.

Specifically, the first part 110F has a group of ribs 120F that projects toward the second part 210F. In FIG. 8, the group of ribs 120F includes three ribs 120E-1, 120E-2 and 120E-3. However, the number of ribs may be appropriately selected.

The ribs 120E-1, 120E-2 and 120E-3 are formed around the entire circumference of the opening 11. For example, the ribs 120E-1, 120E-2 and 120E-3 may be formed so as to have a uniform cross section around the entire circumference of the opening. The example shown in FIG. 8 can also achieve the same effect as that of the example shown in FIG. 2. The shape of the second part 210F on the lid body 21F side and the shape of the first part 110F on the container body 10F side may be exchanged.

Figure 9:
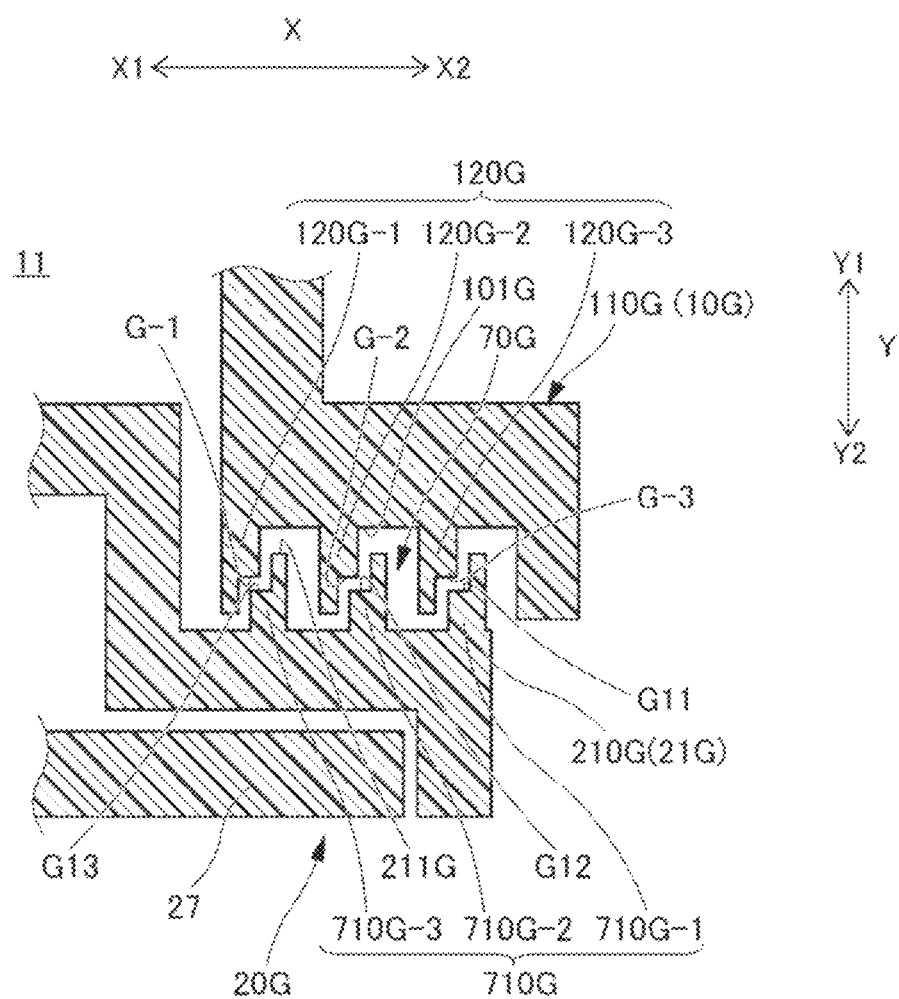
FIG. 9 is a schematic cross-sectional view showing another exemplary labyrinth seal structure.

FIG. 9 is a schematic cross-sectional diagram showing another exemplary labyrinth seal structure 70G. FIG. 9 shows an example where fine steps are provided in the ribs of the container body and the lid body. The example shown in FIG. 9 differs from the example shown in FIG. 5 in that: the container body 10C is replaced with a container body 10G; and the lid 20C is replaced with a lid 20G.

The container body 10G differs from the container body 10C shown in FIG. 5 in that the first part 110C is replaced with a first part 110G. The lid 20G differs from the lid 20C shown in FIG. 5 in that the lid body 21C is replaced with a lid body 21G. The lid body 21G differs from the lid body 21C shown in FIG. 5 in that the second part 210C is replaced with a second part 210G.

As shown in FIG. 9, the first part 110G of the container body 10G, the first part 110G being provided around the opening 11, is non-contact at least partially with the second part 210G of the lid 20G, the second part 210G being opposed to the first part 110G. The first part 110G and the second part 210G cooperatively form the labyrinth seal structure 70G. The labyrinth seal structure 70G is formed by the surface 101G of the first part 110G and the surface 211G of the second part 210G.

Specifically, the first part 110G has a group of ribs 120G that projects toward the second part 210G. In FIG. 9, the group of ribs 210G includes three ribs 120G-1, 120G-2 and 120G-3. However, the number of ribs may be appropriately selected. The second part 210G has a group of ribs 710G that projects toward the first part 110G. In FIG. 9, the group of ribs 710G includes three ribs 710G-1, 710G-2 and 710G-3. However, the number of ribs may be appropriately selected.

As shown in FIG. 9, fine step portions G-1, G-2, and G-3 are formed in the ribs 120G-1, 120G-2 and 120G-3. Fine step portions G11, G12 and G13 are formed in the ribs 710G-1, 710G-2 and 710G-3.

The ribs 120G-1, 120G-2, 120G-3 and the ribs 710G-1, 710G-2, 710G-3 are formed around the entire circumference of the opening 11. The example shown in FIG. 9 can also achieve the same effect as that of the example shown in FIG. 2.

Figure 10:
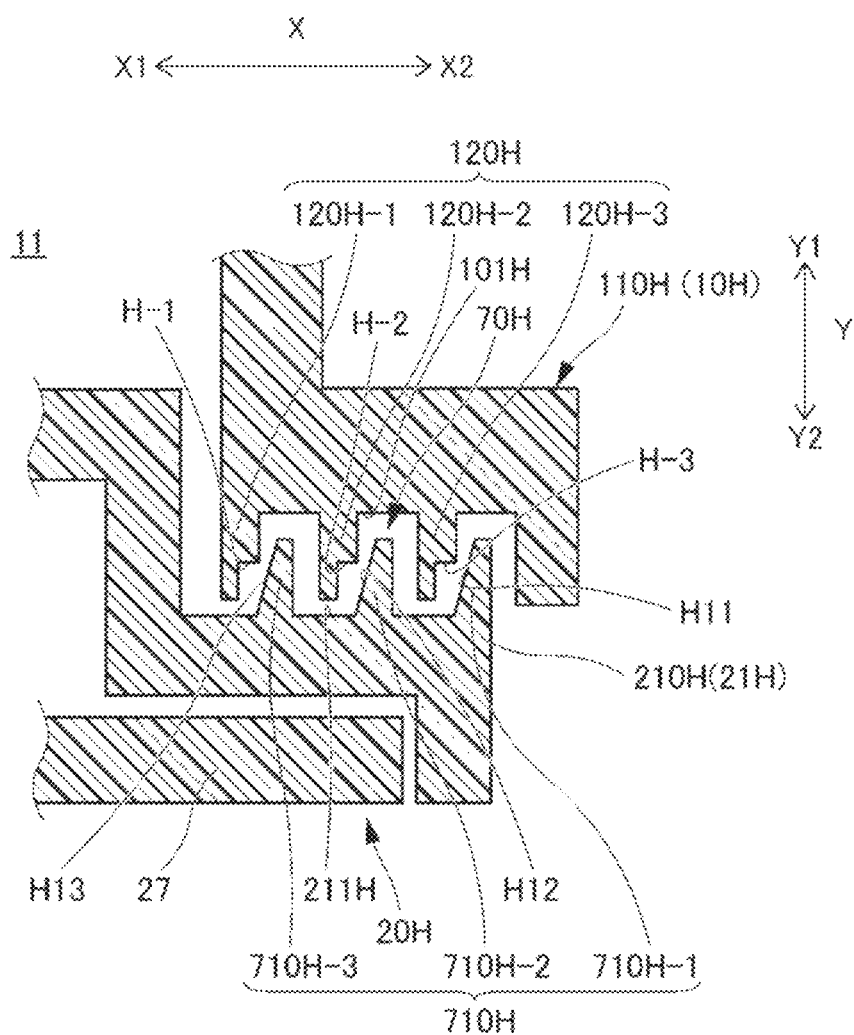
FIG. 10 is a schematic cross-sectional view showing another exemplary labyrinth seal structure.

FIG. 10 is a schematic cross-sectional diagram showing another exemplary labyrinth seal structure 70H. FIG. 10 shows an example where ribs are provided on the container body and the lid body; and fine steps are provided in the ribs of the container body.

The example shown in FIG. 10 differs from the example shown in FIG. 5 in that: the container body 10C is replaced with a container body 10H; and the lid 20C is replaced with a lid 20H.

The container body 10H differs from the container body 10C shown in FIG. 5 in that the first part 110C is replaced with a first part 110H. The lid 20H differs from the lid 20C shown in FIG. 5 in that the lid body 21C is replaced with a lid body 21H. The lid body 21H differs from the lid body 21C shown in FIG. 5 in that second part 210C is replaced with second part 210H.

As shown in FIG. 10, the first part 110H of the container body 10H, the first part 110H being provided around the opening 11, is non-contact at least partially with the second part 210H of the lid 20H, the second part 210H being opposed to the first part 110H. The first part 110H and the second part 210H cooperatively form the labyrinth seal structure 70H. The labyrinth seal structure 70H is formed by the surface 101H of the first part 110H and the surface 211H of the second part 210H.

Specifically, the first part 110H has a group of ribs 120H that projects toward the second part 210H. In FIG. 10, the group of ribs 210H includes three ribs 120H-1, 120H-2 and 120H-3. However, the number of ribs may be appropriately selected. The second part 210H has a group of ribs 710H that projects toward the first part 110H.

In FIG. 10, the group of ribs 710H includes three ribs 710H-1, 710H-2 and 710H-3. However, the number of ribs may be appropriately selected. As shown in FIG. 10, fine step portions H-1, H-2, and H-3 are formed in the ribs 120H-1, 120H-2 and 120H-3.

Peripheral surfaces of the ribs 710H-1, 710H-2 and 710H-3 on the inner side are formed to be slants H11, H12 and H13 that are inclined outwardly as proceeding to the Y1 side. The ribs 120H-1, 120H-2, 120H-3 and the ribs 710H-1, 710H-2, 710H-3 are formed around the entire circumference of the opening 11. The example shown in FIG. 10 can also achieve the same effect as that of the example shown in FIG. 2.

Figure 11:
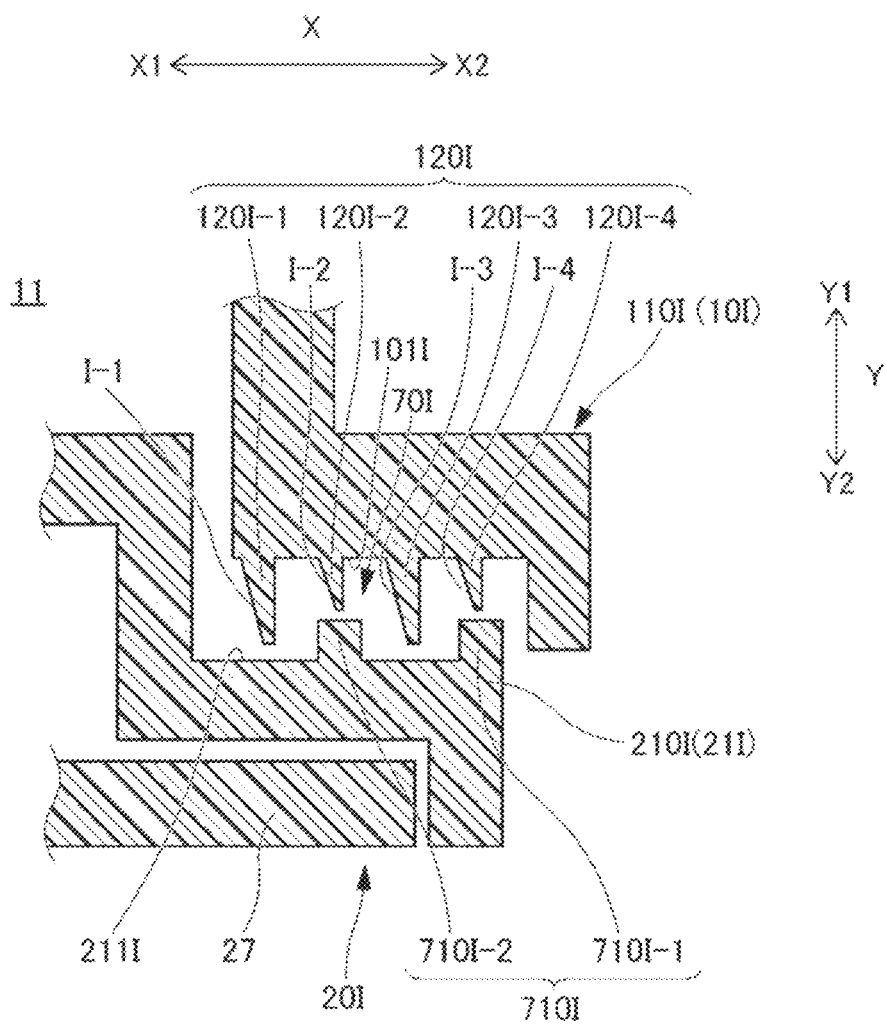
FIG. 11 is a schematic cross-sectional view showing another exemplary labyrinth seal structure.

FIG. 11 is a schematic cross-sectional diagram showing another exemplary labyrinth seal structure 70I. FIG. 11 shows an example where the shapes of the ribs of the container body and the lid body are different.

The example shown in FIG. 11 differs from the example shown in FIG. 5 in that: the container body 10C is replaced with a container body 10I; and the lid 20C is replaced with a lid 20I.

The container body 10I differs from the container body 10C shown in FIG. 5 in that the first part 110C is replaced with a first part 110I. The lid 20I differs from the lid 20C shown in FIG. 5 in that the lid body 21C is replaced with a lid body 21I. The lid body 21I differs from the lid body 21C shown in FIG. 5 in that the second part 210C is replaced with a second part 210I.

As shown in FIG. 11, the first part 110I of the container body 10I, the first part 110I being provided around the opening 11, is non-contact at least partially with the second part 210I of the lid 20I, the second part 210I being opposed to the first part 110I. The first part 110I and the second part 210I cooperatively form the labyrinth seal structure 70I. The labyrinth seal structure 70I is formed by the surface 101I of the first part 110I and the surface 211I of the second part 210I.

Specifically, the first part 110I has a group of ribs 120I that projects toward the second part 210I. In FIG. 11, the group of ribs 210I includes four ribs 120I-1, 120I-2, 120I-3 and 120I-4. However, the number of ribs may be appropriately selected. The second part 210I has a group of ribs 710I that projects toward the first part 110I.

In FIG. 11, the group of ribs 710I includes two ribs 710I-1 and 710I-2. However, the number of ribs may be appropriately selected. As shown in FIG. 11, peripheral surfaces of the ribs 120I-1, 120I-2, 120I-3 and 120I-4 on the inner side are formed to be slants I-1, I-2, I-3 and I-4 that are inclined outwardly as proceeding to the Y2 side.

The ribs 120I-2 and 120I-4 corresponding to the ribs 710I-2 and 710I-1 are formed to be lower than the ribs 120I-1 and 120I-3. The ribs 120I-1 and 120I-3 are formed so as to be close to the surface 211I of the second part 210I beyond tip edges of the ribs 710I-2 and 710I-1.

The ribs 120I-1, 120I-2, 120I-3, 120I-4 and the ribs 710I-1, 710I-2 are formed around the entire circumference of the opening 11. The example shown in FIG. 11 can also achieve the same effect as that of the example shown in FIG. 2. The shape of the second part 210I on the lid body 21I side and the shape of the first part 110 on the container body 10I side may be exchanged.

Figure 12:
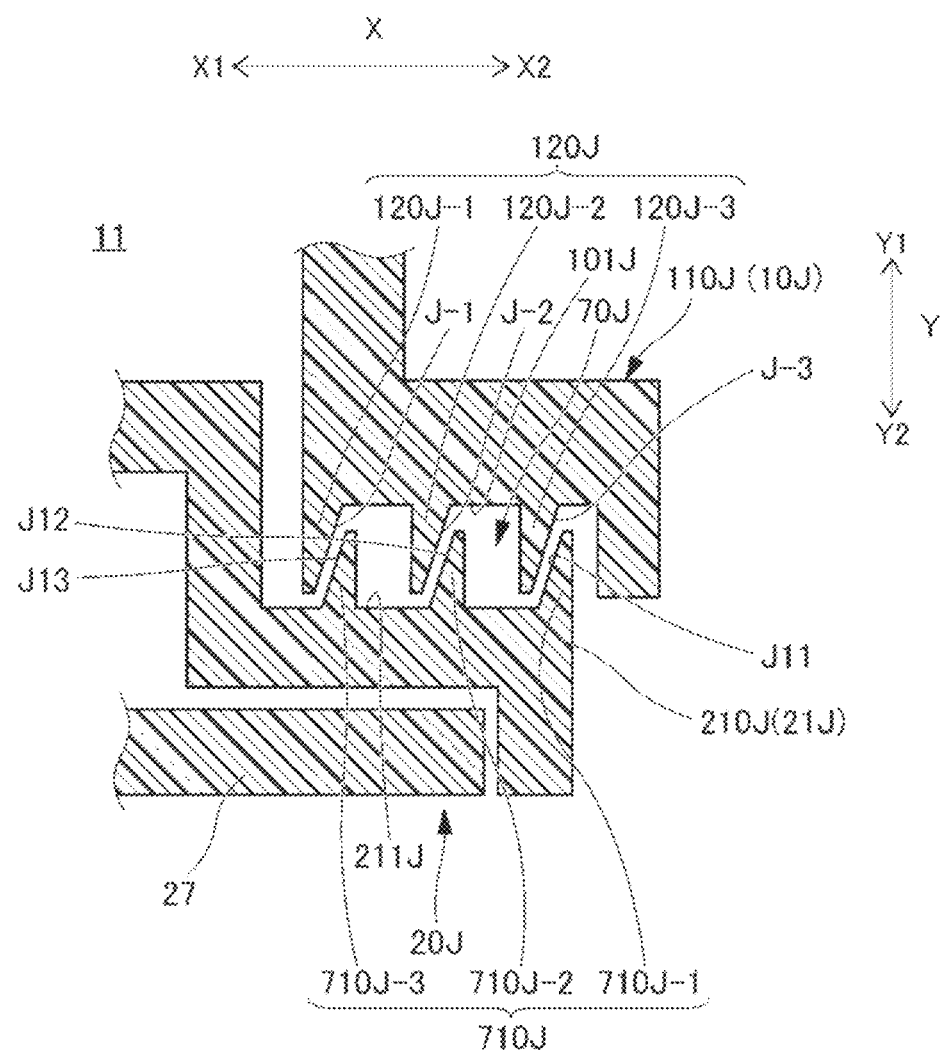
FIG. 12 is a schematic cross-sectional view showing another exemplary labyrinth seal structure.

FIG. 12 is a schematic cross-sectional diagram showing another exemplary labyrinth seal structure 70J. The example shown in FIG. 12 differs from the example shown in FIG. 5 in that: the container body 10C is replaced with a container body 10J; and the lid 20C is replaced with a lid 20J.

The container body 10J differs from the container body 10C shown in FIG. 5 in that the first part 110C is replaced with a first part 110J.

The lid 20J differs from the lid 20C shown in FIG. 5 in that the lid body 21C is replaced with a lid body 21J. The lid body 21J differs from the lid body 21C shown in FIG. 5 in that the second part 210C is replaced with the second part 210J.

As shown in FIG. 12, the first part 110J of the container body 10J, the first part 110J being provided around the opening 11, is non-contact at least partially with the second part 210J of the lid 20J, the second part 210J being opposed to the first part 110J. The first part 110J and the second part 210J cooperatively form the labyrinth seal structure 70J. The labyrinth seal structure 70J is formed by the surface 101J of the first part 110J and the surface 211J of the second part 210J.

Specifically, the first part 110J has a group of ribs 120J that projects toward the second part 210J. In FIG. 12, the group of ribs 120J includes three ribs 120J-1, 120J-2 and 120J-3. However, the number of ribs may be appropriately selected. The second part 210J has a group of ribs 710J that projects toward the first part 110J.

In FIG. 12, the group of ribs 710J includes three ribs 710J-1, 710J-2 and 710J-3. However, the number of ribs may be appropriately selected. As shown in FIG. 12, peripheral surfaces of the ribs 120J-1, 120J-2 and 120J-3 on the outer side are formed to be slants J-1, J-2 and J-3 that are inclined inwardly as proceeding to the Y2 side.

Peripheral surfaces of the ribs 710J-1, 720J-2 and 710J-3 on the inner side are formed to be slants J11, J12 and J13 that are inclined outwardly as proceeding to the Y1 side.

The ribs 120J-1, 120J-2, 120J-3 and the ribs 710J-1, 710J-2, 710J-3 are formed around the entire circumference of the opening 11. The example shown in FIG. 12 can also achieve the same effect as that of the example shown in FIG. 2.

Figure 13:
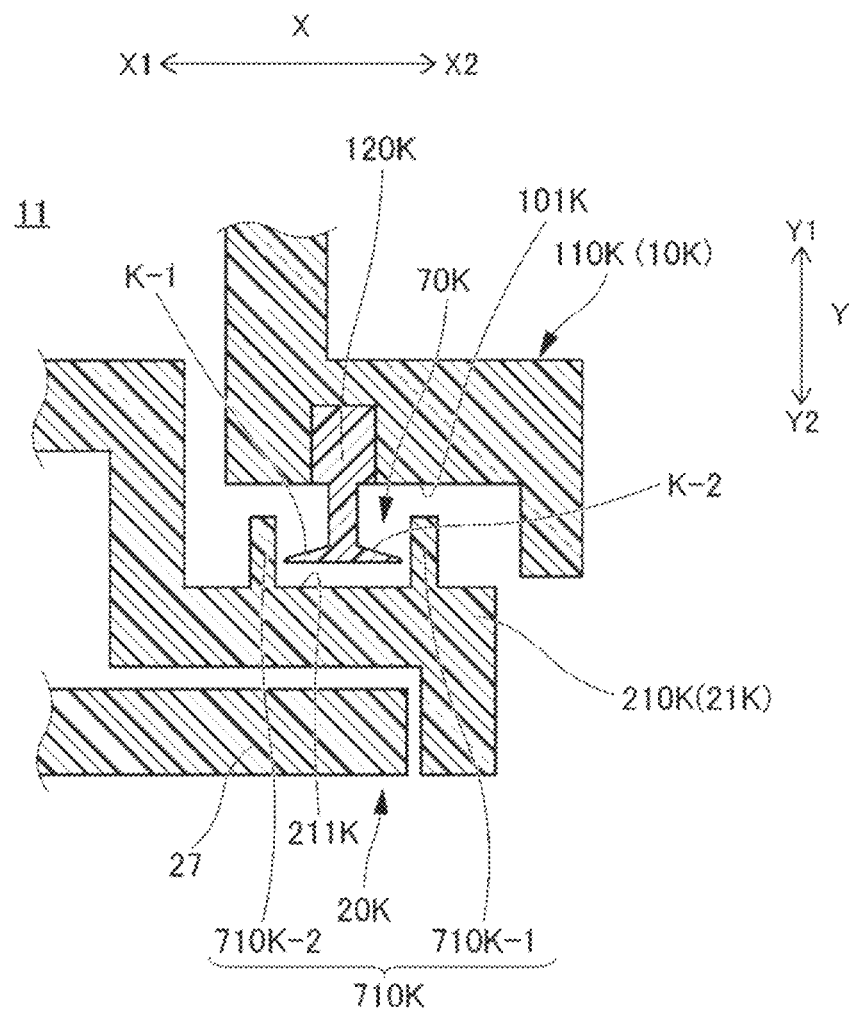
FIG. 13 is a schematic cross-sectional view showing another exemplary labyrinth seal structure.

FIG. 13 is a schematic cross-sectional diagram showing another exemplary labyrinth seal structure 70K. The example shown in FIG. 13 differs from the example shown in FIG. 5 in that: the container body 10C is replaced with a container body 10K; and the lid 20C is replaced with a lid 20K.

The container body 10K differs from the container body 10C shown in FIG. 5 in that the first part 110C is replaced with a first part 110K. The lid 20K differs from the lid 20C shown in FIG. 5 in that the lid body 21C is replaced with a lid body 21K. The lid body 21K differs from the lid body 21C shown in FIG. 5 in that the second part 210C is replaced with a second part 210K.

As shown in FIG. 13, the first part 110K of the container body 10K, the first part 110K being provided around the opening 11, is non-contact at least partially with the second part 210K of the lid 20K, the second part 210K being opposed to the first part 110K. The first part 110K and the second part 210K cooperatively form the labyrinth seal structure 70K. The labyrinth seal structure 70K is formed by the surface 101K of the first part 110K and the surface 211K of the second part 210K.

Specifically, the first part 110K has a rib 120K that projects toward the second part 210K. The second part 210K has a group of ribs 710K that projects toward the first part 110K. In FIG. 13, the group of ribs 710K includes two ribs 710K-1 and 710K-2. However, the number of ribs may be appropriately selected. The rib 120K is formed by an insert member and is inserted into the container body 10K.

The rib 120K has protrusions K-2 and K-1 of which tip edges are respectively directed toward the ribs 710K-1 and 710K-2 on the outer peripheral side. As a material of the rib 120K, it is possible to use thermoplastic elastomers such as polyester-based elastomers, polyolefin-based elastomers, fluorine-based elastomers or urethane-based elastomers; or elastic bodies such as fluorine rubber, ethylene propylene rubber or silicone rubber. From the viewpoint of modifying the sealing properties, these materials may contain a filler made of carbon, glass fiber, mica, talc, silica, calcium carbonate or the like; or a resin such as polyethylene, polyamide, polyacetal, a fluorine-based resin or a silicone resin, which are added selectively in a predetermined amount. Further, from the viewpoint of imparting conductivity and antistatic properties, carbon fibers, metal fibers, metal oxides, various antistatic agents and the like may be appropriately added.

The rib 120K and the ribs 710K-1, 710K-2 are formed around the entire circumference of the opening 11. The example shown in FIG. 13 can also achieve the same effect as that of the example shown in FIG. 2. The configuration of FIG. 13 has the effect that two narrow flow passages can be achieved in a narrow dimension in the X direction, since the rib 120K has the two protrusions K-1 and K-2. It is also effective to form the rib 120K with an elastic body by insert molding, since the permissible range of dimensional tolerance can be widened. The shape of the second part 210K on the lid body 21K side and the shape of the first part 110K on the container body 10K side may be exchanged.

Figure 14:
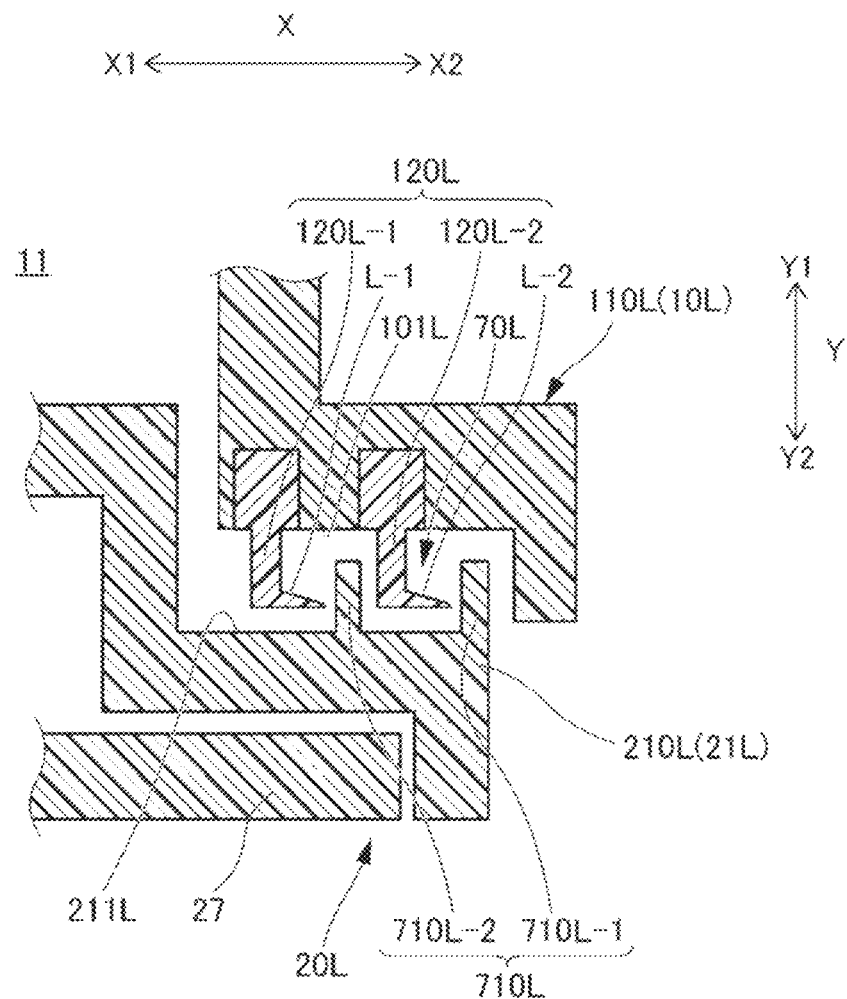
FIG. 14 is a schematic cross-sectional view showing another exemplary labyrinth seal structure.

FIG. 14 is a schematic cross-sectional diagram showing another exemplary labyrinth seal structure 70L. The example shown in FIG. 14 differs from the example shown in FIG. 5 in that: the container body 10C is replaced with a container body 10L; and the lid 20C is replaced with a lid 20L.

The container body 10L differs from the container body 10C shown in FIG. 5 in that the first part 110C is replaced with a first part 110L. The lid 20L differs from the lid 20C shown in FIG. 5 in that the lid body 21C is replaced with a lid body 21L. The lid body 21L differs from the lid body 21C shown in FIG. 5 in that the second part 210C is replaced with a second part 210L.

As shown in FIG. 14, the first part 110L of the container body 10L, the first part 110L being provided around the opening 11, is non-contact at least partially with the second part 210L of the lid 20L, the second part 210L being opposed to the first part 110L. The first part 110L and the second part 210L cooperatively form the labyrinth seal structure 70L. The labyrinth seal structure 70L is formed by the surface 101L of the first part 110L and the surface 211L of the second part 210L.

Specifically, the first part 110L has a group of ribs 120L that projects toward the second part 210L. In FIG. 14, the group of ribs 120L includes ribs 120L-1 and 120L-2. However, the number of ribs may be appropriately selected. The second part 210L has a group of ribs 710L that projects toward the first part 110L. In FIG. 14, the group of ribs 710L includes two ribs 710L-1 and 710L-2. However, the number of ribs may be appropriately selected.

The ribs 120L-1 and 120L-2 are formed by insert members and are inserted into the container body 10L. The two ribs 120L-1 and 120L-2 have protrusions L-1 and L-2 respectively, of which tip edges are respectively directed toward the ribs 710L-2 and 710L-1 on the outer peripheral sides.

The ribs 120L-1 and 120L-2 are made of a resin material such as polycarbonate, cycloolefin polymer, liquid crystal polymer, polyether ether ketone or polypropylene.

The ribs 120L-1, 120L-2 and the ribs 710L-1, 710L-2 are formed around the entire circumference of the opening 11. The example shown in FIG. 14 can also achieve the same effect as that of the example shown in FIG. 2.

Figure 15:
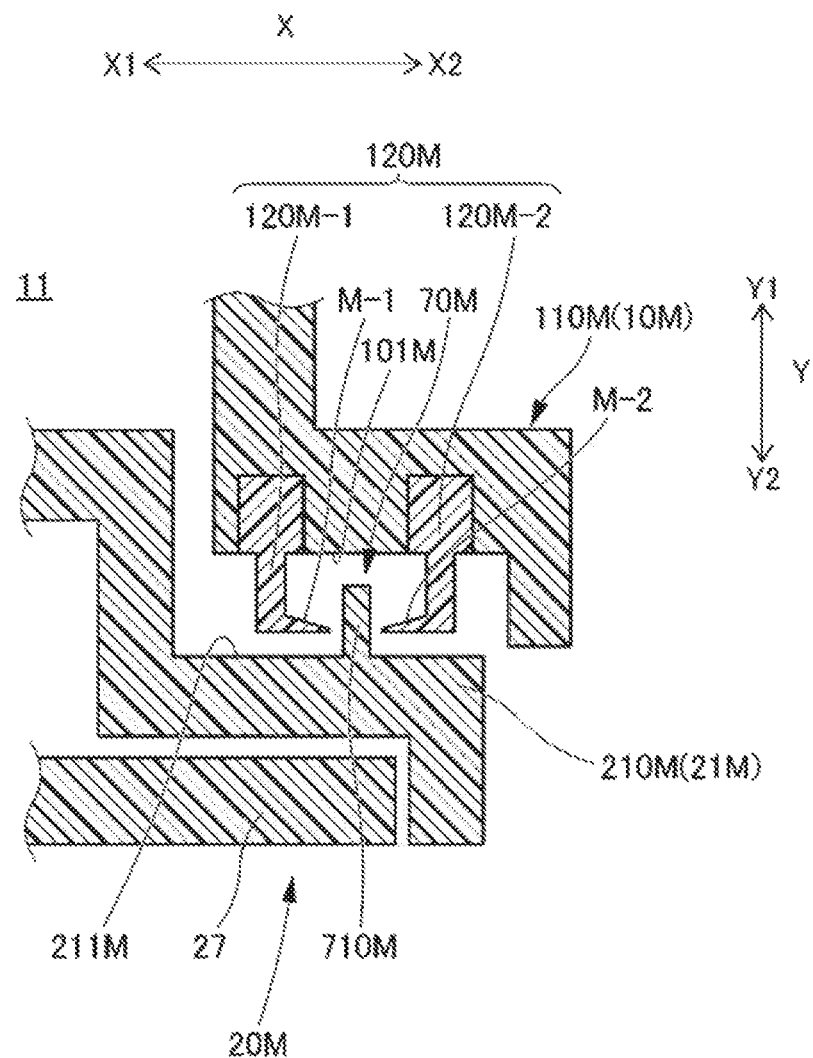
FIG. 15 is a schematic cross-sectional view showing another exemplary labyrinth seal structure.

FIG. 15 is a schematic cross-sectional diagram showing another exemplary labyrinth seal structure 70M. In the example shown in FIG. 15, the same components as those in the examples described above are denoted by the same reference signs, and description thereof may be omitted. The example shown in FIG. 15 differs from the example shown in FIG. 5 in that: the container body 10C is replaced with a container body 10M; and the lid 20C is replaced with a lid 20M.

The container body 10M differs from the container body 10C shown in FIG. 5 in that the first part 110C is replaced with a first part 110M. The lid 20M differs from the lid 20C shown in FIG. 5 in that the lid body 21C is replaced with a lid body 21M. The lid body 21M differs from the lid body 21C shown in FIG. 5 in that the second part 210C is replaced with a second part 210M.

As shown in FIG. 15, the first part 110M of the container body 10M, the first part 110M being provided around the opening 11, is non-contact at least partially with the second part 210M of the lid 20M, the second part 210M being opposed to the first part 110M. The first part 110M and the second part 210M cooperatively form the labyrinth seal structure 70M. The labyrinth seal structure 70M is formed by the surface 101M of the first part 110M and the surface 211M of the second part 210M.

Specifically, the first part 110M has a group of ribs 120M that projects toward the second part 210M. In FIG. 15, the group of ribs 120M includes ribs 120M-1 and 120M-2. However, the number of ribs may be appropriately selected. The second part 210M has a rib 710M that projects toward the first part 110M. The ribs 120M-1 and 120M-2 are formed by insert members and are inserted into the container body 10M.

The two ribs 120M-1 and 120M-2 respectively have protrusions M-1 and M-2, both being directed towards the rib 710M. The ribs 120M-1 and 120M-2 are made of a resin material such as polycarbonate, cycloolefin polymer, liquid crystal polymer, polyether ether ketone or polypropylene.

The ribs 120M-1, 120M-2 and the rib 710M are formed around the entire circumference of the opening 11. The example shown in FIG. 15 can also achieve the same effect as that of the example shown in FIG. 2. The shape of the second part 210M on the lid body 21M side and the shape of the first part 110M on the container body 10M side may be exchanged.

The second parts 210K, 210L and 210M respectively shown in FIGS. 13, 14 and 15 are made of resin materials having high slidability, such as polypropylene, polyether ketone, polybutylene terephthalate or polyacetal. Incidentally, even when the lids 20K, 20L and 20M are required to have low-hygroscopicity, the second parts 210K, 210L and 210M may be made of materials that are not low-hygroscopic, since the second parts 210K, 210L and 210M are relatively small parts of the lids 20K, 20L and 20M.

As materials of the second parts 210K, 210L and 210M, it is possible to use thermoplastic elastomers such as polyester-based elastomers, polyolefin-based elastomers, fluorine-based elastomers or urethane-based elastomers; or elastic bodies such as fluorine rubber, ethylene propylene rubber or silicone rubber. From the viewpoint of modifying the sealing properties, these materials may contain a filler made of carbon, glass fiber, mica, talc, silica, calcium carbonate or the like; or a resin such as polyethylene, polyamide, polyacetal, a fluorine-based resin or a silicone resin, which are added selectively in a predetermined amount. Further, from the viewpoint of imparting conductivity and antistatic properties, carbon fibers, metal fibers, metal oxides, various antistatic agents and the like may be appropriately added.

In the above-mentioned examples, the container body is a relatively large-sized member. Hence, when a fine and complex structure or a separate member is insert-molded, the accuracy can be enhanced by providing such structure or member on the lid side not on the container body side. Therefore, a complex structure or shape is preferably provided on the lid side.

The examples have been described in detail. However, the present disclosure is not limited to any specific examples. Various variations and modifications can be made within the scope of the description in the claims. It is also possible to combine all or some of the components of the examples described above.

REFERENCE SIGNS LIST

1 substrate storage container,
10 container body,
10C container body,
11 opening,
12 seal face,
13 support body,
14 robotic flange,
15 manual handle,
18 air supply valve,
19 air exhaust valve,
20 lid,
21 lid body,
26 locking mechanism,
27 plate,
30 front retainer,
70A labyrinth seal structure,
101 surface,
102 surface,
110 first part,
210 second part,
211 surface,
212 surface,
701 narrow portion,
702 enlarged portion,
710 group of ribs,
A-A line,
P0 interior,
P1 exterior,
W substrate,
$\delta 1$ clearance,
$\delta 2$ clearance.

The invention claimed is:

1. A substrate storage container, comprising:
a container body configured to store at least one substrate; and
a lid configured to be detachably fitted to and close an opening of the container body,
wherein the lid includes a pair of locking mechanisms, configured for locking by engaging latch claws of the locking mechanisms in latch holes formed in the container body,
wherein a first part of the container body, the first part being provided around the opening, is non-contact at least partially with a second part of the lid, the second part being opposed to the first part; and the first part and the second part cooperatively form a labyrinth seal structure,
at least one of the first part and the said second part has at least one rib that is formed entirely around a circumference of the opening and projects towards the other of the first part and the second part, the at least one rib forming the labyrinth seal structure,
the at least one rib is made of elastic body.

2. The substrate storage container according to claim 1, wherein
the labyrinth seal structure is formed entirely around the circumference of the opening.

3. The substrate storage container according to claim 1, wherein
the first part has a first surface; and the second part has a first surface, the first surface of the first part being facing the first surface of the second part in a first direction that is substantially parallel to a surface of the at least one substrate when the at least one substrate is stored in the container body, and
the labyrinth seal structure is formed by the first surface of the first part and the first surface of the second part.

4. The substrate storage container according to claim 1, wherein
the at least one rib comprises two or more ribs.

5. The substrate storage container according to claim 4, wherein
the two or more ribs have a height difference within 10 millimeters.

6. The substrate storage container according to claim 1, wherein
the second part is made of a material different from a material of a lid body of the lid.

7. The substrate storage container according to claim 6, wherein
the second part is a separate body from the lid body of the lid and is attached to the lid body of the lid.

* * * * *